US 6,738,173 B2

(12) United States Patent
Bonthron et al.

(10) Patent No.: US 6,738,173 B2
(45) Date of Patent: May 18, 2004

(54) LIMITING AMPLIFIER MODULATOR DRIVER

(76) Inventors: Andrew Bonthron, 555 S. Barrington Ave. # 125, Los Angeles, CA (US) 90049; Richard Nottenburg, 71 Ettl Cir., Princeton, NJ (US) 08540

( * ) Notice: Subject to any disclaimer, the term of this patent is extended or adjusted under 35 U.S.C. 154(b) by 0 days.

(21) Appl. No.: 09/892,807

(22) Filed: Jun. 26, 2001

(65) Prior Publication Data

US 2003/0147428 A1 Aug. 7, 2003

(51) Int. Cl.[7] .............................. G02F 1/01; H04J 3/04; H04J 7/00; H04L 25/34; G01J 1/34
(52) U.S. Cl. .................. 359/238; 370/533; 370/213; 375/288; 375/257; 250/227.21; 398/190
(58) Field of Search ............................. 359/238, 276, 359/278; 370/533, 213, 535, 532, 537; 375/288, 257, 260; 250/227.21; 398/37, 58, 90, 141, 142, 190

(56) References Cited

U.S. PATENT DOCUMENTS 5,119,402 A * 6/1992 Ginzburg et al. ............ 375/288
5,401,957 A * 3/1995 Suzuki et al. ............ 250/227.21

* cited by examiner

Primary Examiner—Loha Ben
(74) Attorney, Agent, or Firm—Peninsula IP Group; Douglas A. Chaikin (57) ABSTRACT

Apparatus for driving an optical system modulator to modulate data signals onto a light wave of the optical system. The modulator driver apparatus has a limited amplifier for receiving multiplexed low speed binary data signals and for generating amplified and limited frequency output signals representative of the received multiplexed binary data signals. A differential amplifier connected to an output of the limited amplifier precisely controls the amplitude and generates a low level of over and undershoot of output signals over a wide range of the limited amplifier output signals and has an output connected to central processor unit controlled linear amplifier means for generating gain controlled high fidelity output signals characterized with low over and undershoot and a high extinction ratio for driving the modulator.

16 Claims, 6 Drawing Sheets

LIMITING AMPLIFIER MODULATOR DRIVER

FIELD OF THE INVENTION

The present invention relates to digital communication apparatus and in particular to the apparatus of a modulator driver for driving modulators of digital electro-optical fiber communication systems.

BACKGROUND OF THE INVENTION

High speed digital and optical communication systems are widely installed in many areas of the United States. These types of communication systems generally have transmitter/receiver apparatus and a transmission facility or line interconnecting the transmitter/receiver apparatus to provide a path over which data may be exchanged between the transmitter/receiver apparatus. Increasing advances in technology and the need for more information require greater speed in the rate of transmitting data. The technology has went from analog systems to digital information systems capable of transmitting digital information in the form of logical "0's" and "1's" oftentimes referred to as bits. In an effort to increase the speed of transmission systems, the technology has advanced to the use of optical transmission systems using optical transmitter/receivers interconnected by optical transmission facilities such as optical fibers that transmit optical pulse bit information between the optical transmitter/receivers.

Digital transmitters and receivers are oftentimes connected by long transmission facilities. Typically, a digital transmitter applies binary digital signal information to the transmission facility which is then sent to the receiver which is designed to receive and decode data contained within the received information. The characteristics of the transmission line often times deforms the waveform format of the transmitted information such that the transmitted information is meaningless when it is received by the distant receiver. Thus, long optical fiber transmission lines oftentimes have regenerator or repeater units that connect the output end of an incoming transmission line through the regenerator or repeater units to the input end of an output transmission line. The regenerator or repeater units operate to regenerate the incoming transmission line information and apply the regenerated transmission line information to the outgoing transmission line. At the originating end a transmitter will receive data and modulate the data into optical data which is applied as transmission information to an outgoing transmission line connected to the transmitter. A receiver connected to the output of an incoming transmission line decodes the received transmission line information back into the data.

The transmitters, regenerator or repeater units and the receivers have modulators which function to convert data into optical transmitted transmission line information and the received optical transmission line information into data. Modulator driver (MDR) units are used in these units to control the modulators to provide these conversions. Present modulator driver apparatus have several single compression-limiting amplifiers connected in series to allow the modulator drivers to achieve fast rise and fall times. However, these types of apparatus have poorly controlled performance over necessary input and output range of signals and suffer poorly controlled overshoot, undershoot and eye opening operation. A problem arises in that in providing high speed transmission of data on these systems it is necessary to have a minimal bit error rate and to maximize the extinction ratio of optical data. Additionally, it is very important to minimize the power consumption of the modulator driver unit driving the modulator in that low power is necessary for high density wave division multiplexed applications.

SUMMARY OF THE INVENTION

It is an object of the invention to provide processor controlled low power modular driver apparatus for driving a modulator to receive multiplexed binary data signals and generate high fidelity variable gain output signals with a low level of over and undershoot and with a high extinction ratio for driving the modulator to modulate a light wave in high density wave division multiplexed applications.

It is also an object of the invention to provide processor controlled low power modular driver apparatus having limited amplifier apparatus for receiving multiplexed binary data signals and generating amplified and limited frequency output signals representative of the received multiplexed binary data signals.

It is also an object of the invention to provide processor controlled low power modular driver apparatus having differential amplifier apparatus connected to an output of limited amplifier apparatus for precisely controlling the amplitude and generating a low level of over and undershoot of output signals over a wide range of the limited amplifier output signals in response to limited frequency output signals generated by the limited amplifier apparatus.

It is also an object of the invention to provide processor controlled low power modular driver apparatus having processor controlled linear amplifier apparatus connected to limited and differential amplifier apparatus for generating high fidelity output signals with low over and undershoot and with a high extinction ratio for driving a modulator to modulate a light wave in optical high density wave division multiplexed applications.

In a preferred embodiment of the invention, apparatus for driving a modulator to modulate a light wave in optical high density wave division multiplexed applications has a processor controlled modulator driver for receiving multiplexed binary data signals and generating high fidelity variable gain output signals with a low level of over and undershoot and having a high extinction ratio in response to receipt of the multiplexed binary data signals for driving the modulator to modulate the light wave.

Also in accordance with the preferred embodiment of the invention, apparatus for driving a modulator for modulating data signals onto a light wave has a limited amplifier for receiving multiplexed binary data signals and for generating amplified and limited frequency output signals representative of the received multiplexed binary data signals. The modulator driver apparatus also has a differential amplifier connected to an output of the limited amplifier for precisely controlling the amplitude and generating a low level of over and undershoot of output signals over a wide range of the limited amplifier output signals. Processor controlled linear amplifier means connected to the output of the differential amplifier generates high fidelity output signals with low over and undershoot and a high extinction ratio for driving the modulator.

Also in accordance with the preferred embodiment of the invention, apparatus for driving a modulator to modulate multiplexed binary data signals onto a light wave has a programmed processor for controlling operation of the modulator driving apparatus and a limited amplifier for receiving the multiplexed binary data signals and generating amplified and limited frequency output signals representative of the received multiplexed binary data signals. The modulator apparatus also has a differential amplifier connected to an output of the limited amplifier and controlled by the processor for precisely controlling amplitudes and generating a low level of over and undershoot of output signals over a wide range of the limited amplifier generated limited frequency output signals. A pair of linear amplifiers connected in series to the output of the differential amplifier generates high fidelity output signals with low over and undershoot and a high extinction ratio for driving the modulator. Controller apparatus connected to the differential amplifier and responsive to the processor selectively controls amplitudes of the differential amplifier output signals. A plurality of programmable resistor arrays controlled by the controller in response to instructions generated by the processor supplies power to the linear amplifiers to equalize gains thereof and a peak detector connected to the output of the linear amplifiers detect an absence of linear amplifier generated signals as a loss of signals for modulating the modulator.

BRIEF DESCRIPTION OF THE DRAWINGS

For a further understanding of the objects and advantages of the present invention, reference should be had to the following detailed description, taken in conjunction with the accompanying drawing figures, in which like parts are given like reference numerals and wherein.

The logic component circuitry of the modulator driver apparatus set forth in FIG. 1 through FIG. 5 of the drawing is performed by transistors, circuit elements, peak 16 detectors, controller units, digital-to-analog converters and central processor units, the individual operation of which are well known in the art and the details of which need not be disclosed for an understanding of the invention. Typical examples of these logic circuitry are described in numerous textbooks. For example, such types of logic circuitry, among others, are described by J. Millman and H, Taub in *Pulse, Digital and Switching Waveforms*, 1965, McGraw-Hall, Inc., H. Alex Romanowitz and Russell E. Puckett in *Introduction to Electronics*, 1968, John Wiley & Sons, Inc., E. J. Angelo, Jr. in *Electronic Circuits*, Second Edition, 1958, McGraw Hill, Inc. and in *The TTL Data Book for Design Engineers*, Second Edition, 1976, Texas Instruments Incorporated. Background information on digital transmission on fiber optics may be found on text books by P. Bylanski and D. Ingram, *Digital Transmission Systems,* 1980, Peter Peregrius Ltd, K. Murata et al., *IEE Electron Letters,* 1988, Govind P. Agrawal, *Fiber Optics Communication Systems*, John Wiley and Sons, Inc., 1992 and Ivan Kaminov and Thomas Kotch *Fiber Optics Communication Systems,* 1997, Academic Press.

DETAILED DESCRIPTION OF THE INVENTION

Figure 1:
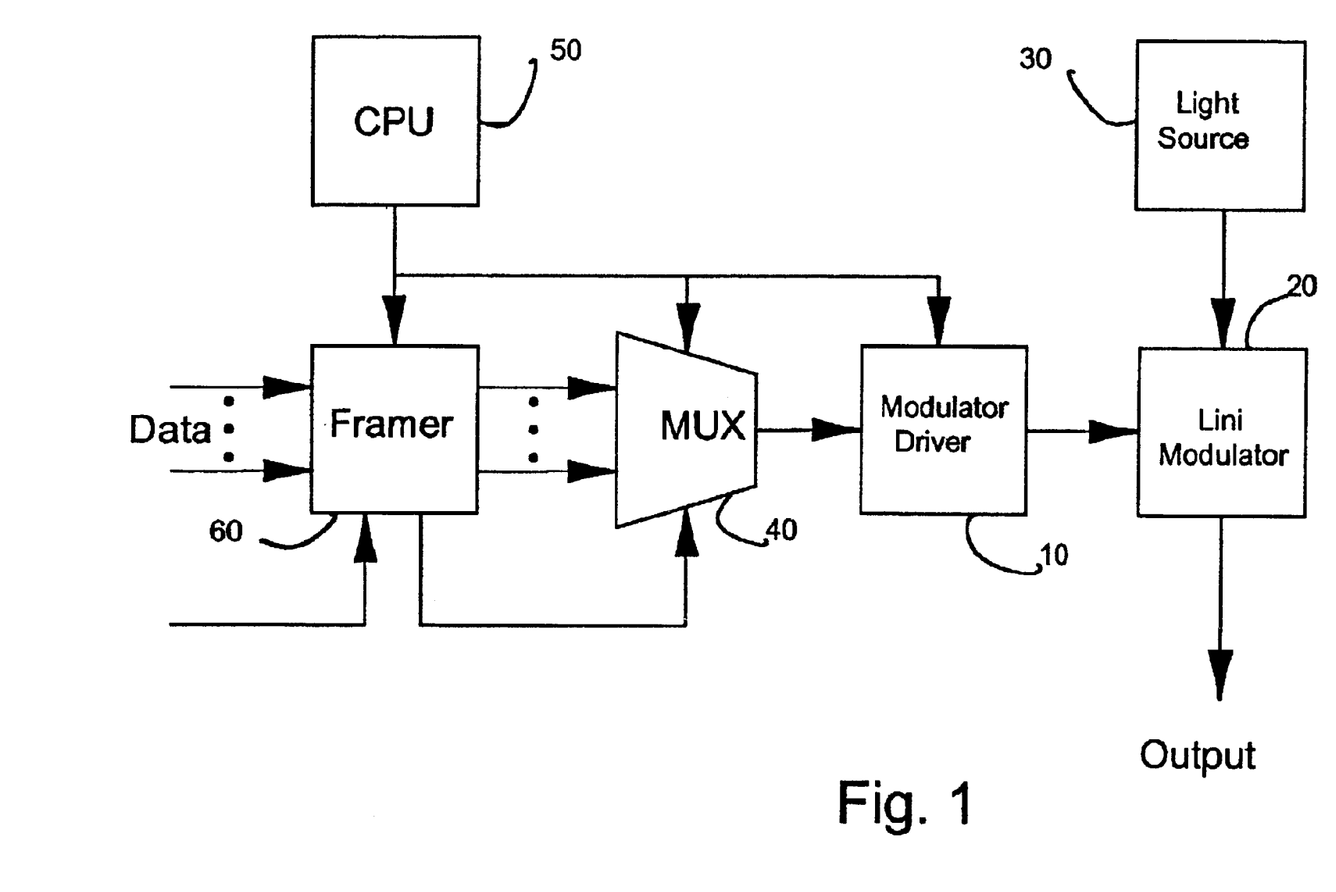
FIG. 1 is a block diagram of electro-optical transmission system apparatus having modulator driver apparatus for driving a modulator of the electro-optical transmission system in accordance with principles of the invention.

With particular reference to FIG. 1 of the drawing, there is shown apparatus for controlling modulator operation of an electro-optical transmission system for modulating information onto the light wave of an optical transmission system. In particular, there is shown apparatus for driving a modulator to modulate a light wave wherein the apparatus has a processor controlled modulator driver for receiving multiplexed binary data signals and generating high fidelity variable gain output signals with a low level of over and undershoot and having a high extinction ratio in response to receipt of the multiplexed binary data signals for driving the modulator to modulate the light wave. In a typical operation, low speed data is applied to the input of a framer chip 60. The framer chip 60 under the operation of a processor 50, which may be any one of a number of programmed a central processor units, generates SONET signals at a typical rate, although not limited thereto, of 600 Mb/s. The data generated by framer 60 is applied to the input of a high speed multiplexer 40 which in turn applies a clean low jitter data signal with a minimal duty cycle distortion to the input of modulator driver 10 with an amplitude of approximately 600 to 800 mv. Modulator driver 10 delivers a high voltage electrical pulses of approximately 9 v to drive electro-optical modulator 20 which in response thereto modulates the light generated by light source 30 and applies the modulated light to a transmission facility or the like.

Figure 2:
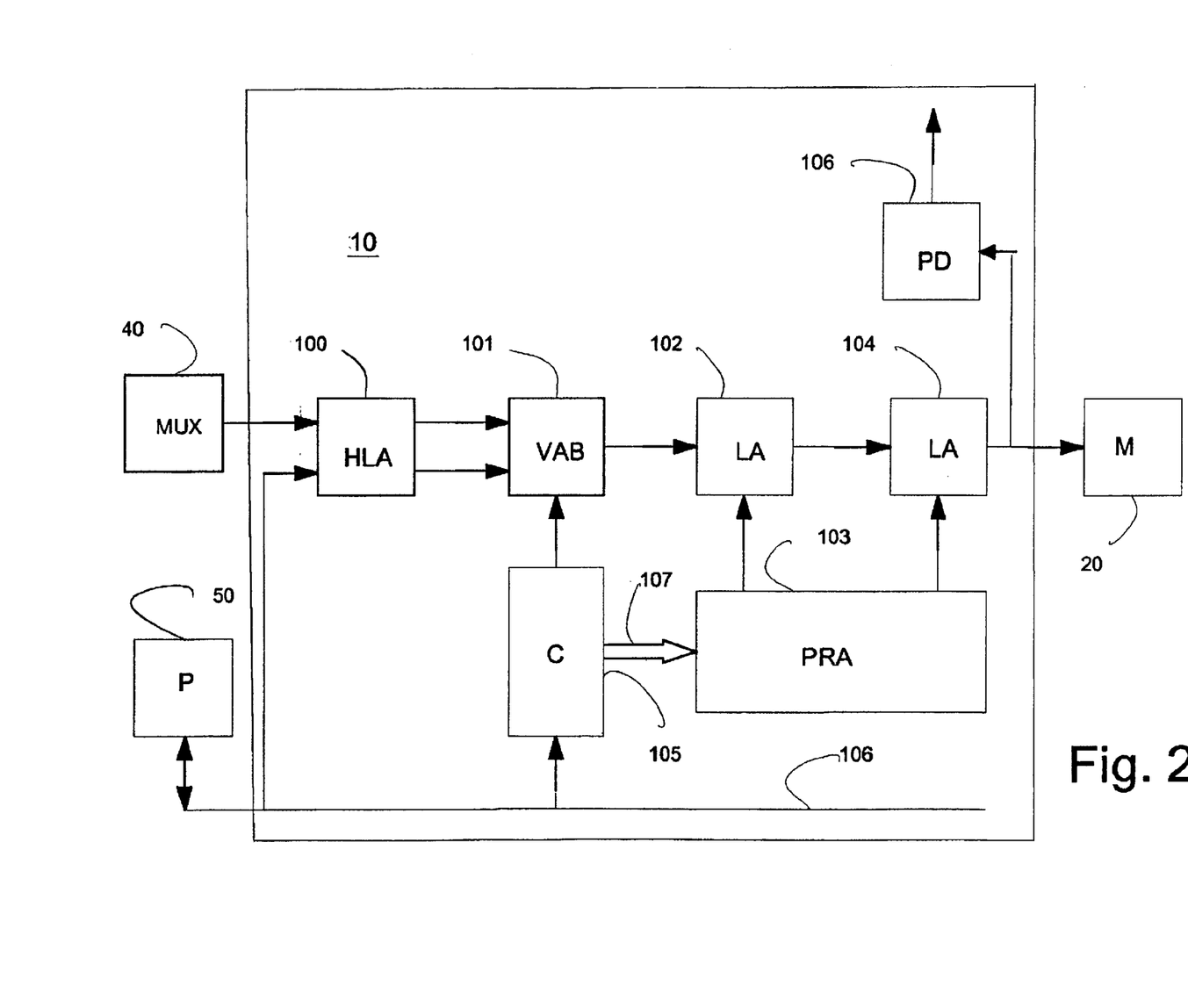
FIG. 2 is a block diagram of the modulator driver apparatus set forth in FIG. 1 for operating the modulator of an electro-optical transmission system.
Figure 3:
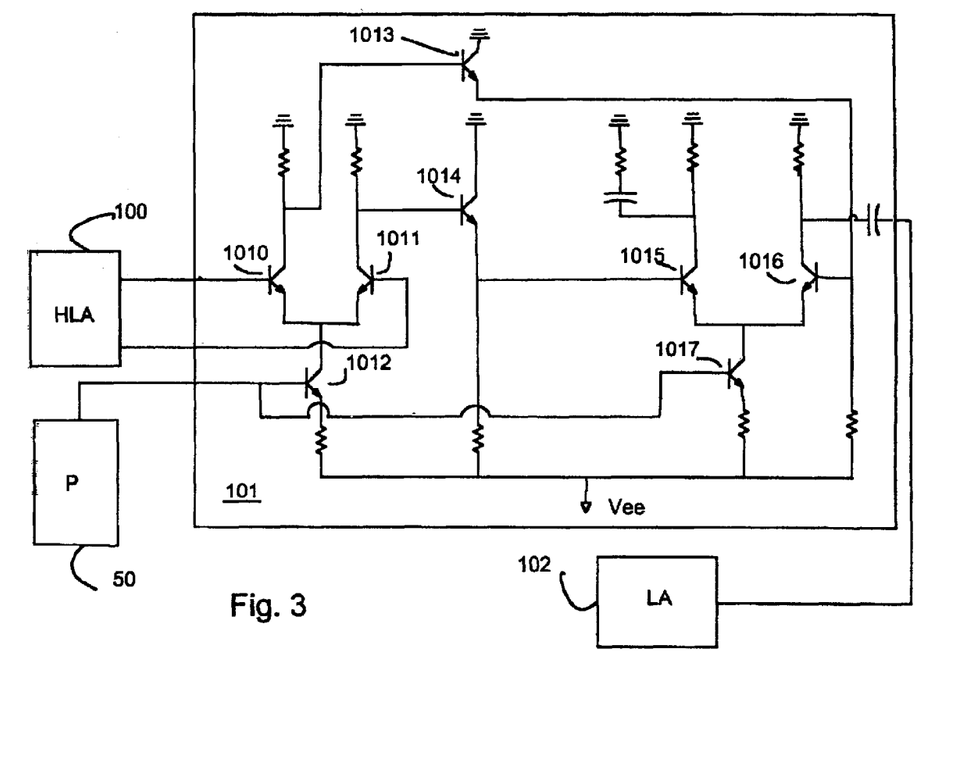
FIG. 3 is a circuit diagram of components of the modulator driver limited amplifier variable amplitude apparatus set forth in FIG. 2.
Figure 4:
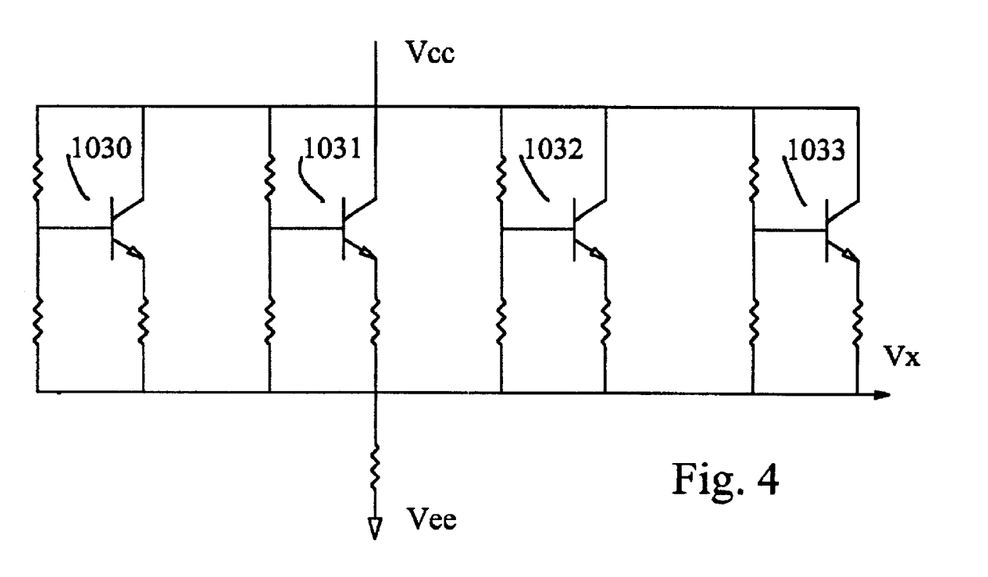
FIG. 4 is a circuit diagram of one of a plurality of resistor cells of the programmable resistor array set forth in FIG. 2 for powering the linear amplifiers.

With particular reference to FIG. 2, there is shown modulator driver 10 having apparatus for use in driving modulator 20 which may be one of a number of modulators such as a lithium niobate modulator. Input information is applied along with duty cycle control information to the inputs of a hard limiting amplifier 100. The hard limiting amplifier 100 is a limited amplifier for receiving multiplexed binary data signals and for generating amplified and limited frequency output signals representative of the received multiplexed binary data signals. It performs single ended to differential signal conversion of the input information and provides a hard limiting function on the input signal. Differential and complementary outputs of the hard limiting amplifier 100 are connected to the inputs of the variable amplitude buffer 101 which generates an output signal from 0 db to a minus 4 db in response to the duty cycle information. The output of variable amplitude buffer is connected to the input of the linear amplifier 102 having an output connected to the input of linear amplifier 104. Programmable resistor array 103 has outputs connected to linear amplifiers 102 and 104 and is controlled by controller 105 in response to instructions from processor 50 to control the response of linear amplifiers 102 and 104 in generating an output for operating modulator 20. The output of linear amplifier 104 is applied to peak detector 106 to indicate a loss of the modulator operating signal to drive modulator 20.

Limited amplifier 100 receives the multiplexed binary data signals and generates a pair of complementary amplified and limited frequency output signals representative of the received multiplexed binary data signals that are applied to variable amplitude buffer 101. Variable amplitude buffer 101 has a differential amplifier, FIG. 3, that is connected to the complementary amplified and limited frequency output signals of the limited amplifier 100 for precisely controlling the amplitude and generating a low level of over and undershoot of output signals over a wide range of the limited amplifier output signals. The amplified and limited frequency output signals of the limited amplifier 100 have fast edges and a certain amount of overshoot and are each applied to an input of current switches 1010 and 1011. Each pair of current switches 1010, 1011 and 1015, 1016 are connected serially in order to minimize pulse distortion when the current flows through circuit elements 1012 and 1017. Processor 50 controls the input to circuit elements 1012 and 1017 that operates to control the current flow through the two pairs of current switches 1010, 1011 and 1015, 1016. The complementary signals incoming from limited amplifier 100 is digital data containing binary bit information in the form commonly referred to as "0's" and "1's". Since variable amplifier buffer 101 operates in a switching mode, the changing of the input signals to circuit elements 1012 and 1017 varies the current through current switches 1010, 1011 and 1015, 1016 thereby generating output signals across the resistance in the collector of current switch 1016. The resistance and capacitance network in the collector of current switches 1015, 1016 and the processor control of the circuit elements provides a symmetrical loading of current switches 1015, 1016 thereby generating variable amplitude pulses at the output of variable amplitude buffer 101.

The variable amplitude pulse output of variable amplitude buffer 101, FIG. 2, is applied to processor controlled linear amplifier apparatus which operate to generate high fidelity output signals with low over and undershoot and a high extinction ratio to drive the modulator 20. The gain of each stage of a linear amplifier will vary over the process of amplifying signals. The limited amplifier apparatus of processor controlled modulator driver 10 has a pair of linear amplifiers 102, 104 connected in series and which have a limited frequency response for filtering and thereby reducing the over and undershoot of signals applied by the differential amplifier components of variable amplitude buffer 101 to the input of the linear amplifier 102. A programmable resistor array 103 controlled by controller 105 in response to instructions generated by processor 50 equalizes the gain of each stage of linear amplifier 102 and 104. Programmable resistor array 103 has a plurality of resistor cells, FIG. 4, each consisting of a plurality of circuit elements 1030, 1031, 1032 and 1033 connect in parallel between voltages Vcc and Vee and each arranged to supply a processor selected a voltages Vx to linear amplifiers 102 and 104, FIG. 2.

Figure 5:
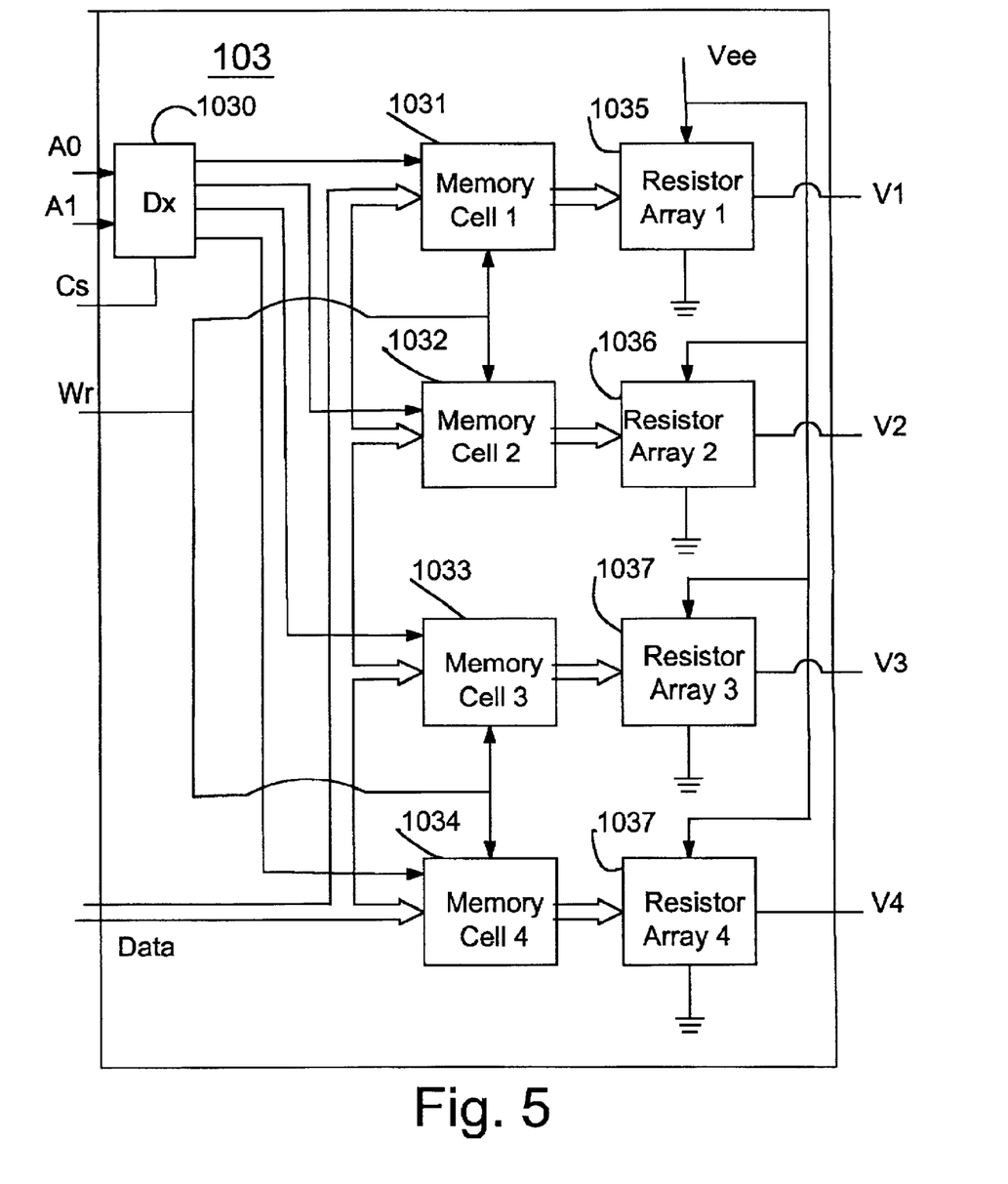
FIG. 5 is a block diagram of apparatus of the programmable resistor array set forth in FIG. 2 for selecting ones of the plurality of resistor cells set forth in FIG. 4.
Figure 6:
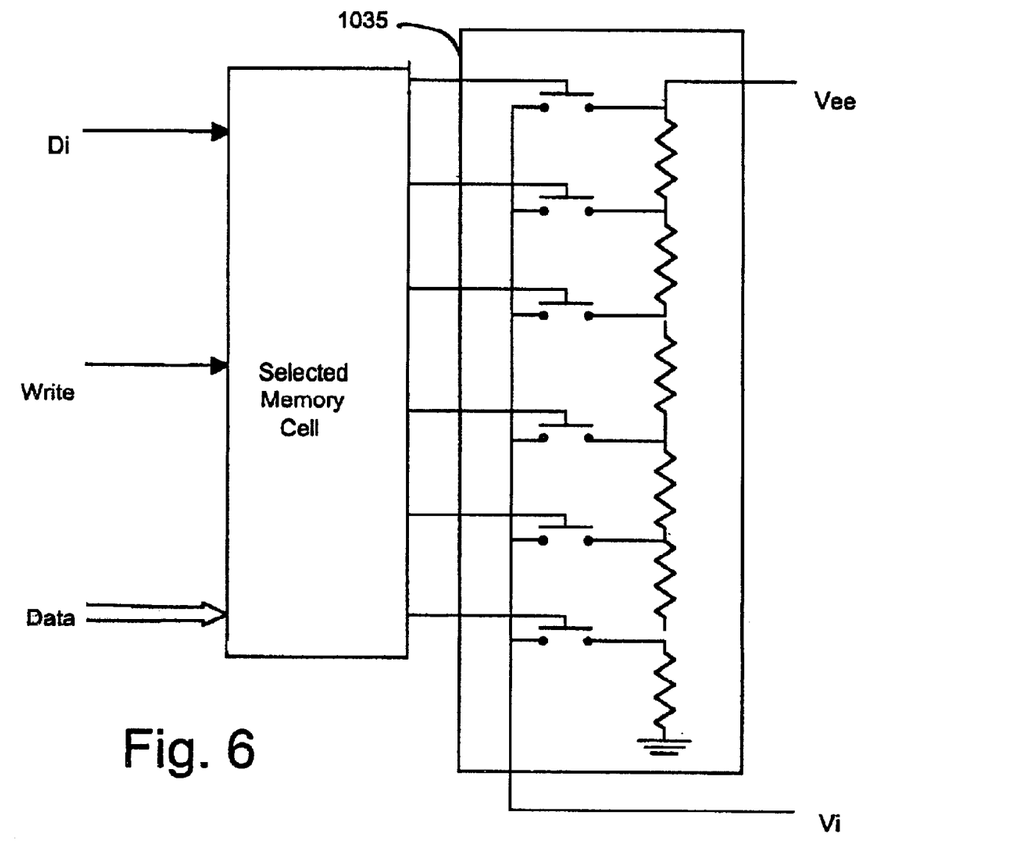
FIG. 6 is a diagram of apparatus controlled by the memory cells of FIG. 5 for powering resister cells of the programmable resistor array set forth in FIG. 4.

Processor 50 controls the gain of the linear amplifiers 102 and 104 over bus 106 by instructing controller 105, via address leads A0, A1 and Cs, FIG. 5, to enable logic Dx 1030 to select ones of the memory cells 1031 through 1034. Data is then sent to the selected one of memory cells to enable the selected memory cell to control the gain of linear amplifiers 102 and 104, FIG. 2, by varying the voltage Vx of a resistor cell, FIG. 4, of the selected one of resistor arrays 1 through 4, FIG. 5 to be one of the voltages V1 through V4. The selected memory cell, FIG. 6, is instructed by the appropriate data information transmitted by processor 50 and over leads Dl and Write to operate switching logic 1035 to vary the voltage Vee supplied to the appropriate resistor cells, FIG. 4, and thereby enable the resistor cells to equalize gains of the linear amplifiers 102 and 104, FIG. 2.

Figure 7:
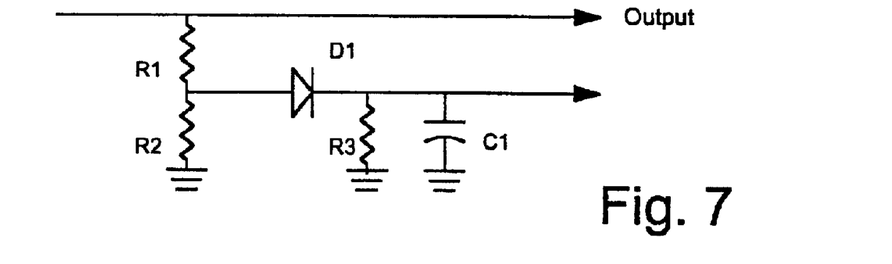
FIG. 7 is a circuit diagram of the modulator driver peak detector set forth in FIG. 2 for determining loss of signals for driving the electro-optical transmission system.

The output of linear amplifier 104 used to drive modulator 20 is also connected to a detector 106 used to detect the absence of linear amplifier generated signals as a loss of modulating signals. The output signals of linear amplifier 104, FIG. 2, used to drive modulator 20 are applied across a resistive divider R1 and R2, FIG. 7, of detector 106 which is used to pre-bias a detector diode D1 for increased sensitivity and to couple a small proportional amount of the signal with minimal distortion. The diode is a high speed Shottkey diode used to rectify the high speed input signal and present the rectified signal to the peak detection capacitor C1. Resistor R3 is used to set the discharge time constant for the peak detection capacitor C1.

It is obvious from the foregoing that the facility, economy and efficiently of optical and digital transmission systems is improved by processor controlled modulator driver apparatus for receiving multiplexed binary data signals and generating high fidelity variable gain output signals with a low level of over and undershoot and having a high extinction ratio in response to receipt of the multiplexed binary data signals for driving modulators of optical-electro transmission systems to modulate light waves. While the foregoing detailed description has described an embodiment of modulator driver apparatus for driving modulators of optical-electro transmission systems, it is to be understood that the above description is illustrative only and is not limiting of the disclosed invention. Particularly other configurations of programmable resistor arrays control apparatus are within the scope and sprit of this invention. Thus, the invention is to be limited only by the claims set forth below.

What is claimed is:

1. Apparatus for driving a modulator to modulate a light wave comprising a processor controlled modulator driver for receiving multiplexed binary data signals and generating high fidelity variable gain output signals with a low level of over and undershoot and having a high extinction ratio in response to receipt of the multiplexed binary data signals for driving the modulator to modulate the light wave.

2. The modulator apparatus set forth in claim 1 wherein the processor controlled modulator driver comprises a limited amplifier for receiving multiplexed binary data signals and for generating amplified and limited frequency output signals representative of the received multiplexed binary data signals.

3. The modulator apparatus set forth in claim 2 wherein the processor controlled modulator driver comprises a differential amplifier connected to an output of the limited amplifier for precisely controlling the amplitude and generating a low level of over and undershoot of output signals over a wide range of the limited amplifier output signals.

4. The modulator apparatus set forth in claim 3 wherein the processor controlled modulator driver comprises a processor controlled linear amplifier apparatus to the output of the differential amplifier for generating high fidelity output signals with low over and undershoot and a high extinction ratio for driving the modulator.

5. The modulator apparatus set forth in claim 4 wherein the processor controlled modulator driver comprises a controller connected to the differential amplifier and responsive to a processor for selectively controlling the amplitude of output pulses of the differential amplifier.

6. The modulator apparatus set forth in claim 5 wherein the processor controlled modulator driver central processor unit controlled linear amplifiers comprises a pair of linear amplifiers having a limited frequency response for filtering and thereby reducing the over and undershoot of signals applied by the differential amplifier to the input of the linear amplifiers.

7. The modulator apparatus set forth in claim 6 wherein the processor controlled modulator driver comprises a plurality of programmable resistor arrays for supplying power to the linear amplifiers.

8. The modulator apparatus set forth in claim 7 wherein the processor controlled modulator driver comprises memory means controlled by the controller for enabling the programmable resistor arrays to equalize gains of the linear amplifiers.

9. The modulator apparatus set forth in claim 8 wherein the processor controlled modulator driver comprises detector means connected to the output of the linear amplifiers for detecting absence of linear amplifier generated signals as a loss of modulating signals.

10. Apparatus for driving a modulator for modulating data signals onto a light wave comprising a limited amplifier for receiving multiplexed binary data signals and for generating amplified and limited frequency output signals representative of the received multiplexed binary data signals, a differential amplifier connected to an output of the limited amplifier for precisely controlling the amplitude and generating a low level of over and undershoot of output signals over a wide range of the limited amplifier output signals, and processor controlled amplifier means connected to the output of the differential amplifier for generating high fidelity output signals with low over and undershoot and a high extinction ratio for driving the modulator.

11. The modulator driving apparatus set forth in claim 10 further comprising a processor controlled controller for enabling the differential amplifier to generate variable amplitude pulses at the output thereof.

12. The modulator driving apparatus set forth in claim 11 wherein the processor controlled amplifier means comprises a pair of linear amplifiers having a limited frequency response for filtering and thereby reducing the over and undershoot of variable amplitude pulses generated by the differential amplifier.

13. The modulator driving apparatus set forth in claim 12 further comprising a plurality of programmable resistor arrays for supplying power to the linear amplifiers.

14. The modulator apparatus set forth in claim 13 wherein the processor controlled driver comprises a plurality of memory cells controlled by the controller for enabling the programmable resistor arrays to equalize gains of each of the pair of linear amplifiers.

15. The modulator apparatus set forth in claim 14 wherein the processor controlled driver comprises a peak detector connected to the output of the linear amplifiers for detecting absence of linear amplifier signals as a loss of modulating signals.

16. Apparatus for driving a modulator to modulate multiplexed binary data signals onto a light wave comprising a processor for controlling operation of the modulator driving apparatus, a limited amplifier for receiving the multiplexed binary data signals and for generating amplified and limited frequency output signals representative of the received multiplexed binary data signals, a differential amplifier connected to an output of the limited amplifier and controlled by the processor for precisely controlling amplitudes and generating a low level of over and undershoot of output signals over a wide range of the limited amplifier generated signals, a pair of linear amplifiers connected in series to the output of the differential amplifier for generating high fidelity output signals with low over and undershoot and a high extinction ratio for driving the modulator, a controller connected to the differential amplifier and responsive to the processor for selectively controlling amplitudes of the differential amplifier output signals, a plurality of programmable resistor arrays controlled by the controller in response to instructions generated by the processor for supplying power to the linear amplifiers to equalize gains thereof, and a peak detector connected to the output of the linear amplifiers for detecting absence of linear amplifier generated signals as a loss of signals for modulating the modulator.

* * * * *